United States Patent [19]

Nelson

[11] Patent Number: 4,639,680
[45] Date of Patent: Jan. 27, 1987

[54] DIGITAL PHASE AND FREQUENCY DETECTOR

[75] Inventor: Alec L. Nelson, Scottsdale, Ariz.

[73] Assignee: Sperry Corporation, New York, N.Y.

[21] Appl. No.: 722,624

[22] Filed: Apr. 12, 1985

[51] Int. Cl.[4] .............................................. H03D 13/00
[52] U.S. Cl. .................................... 328/134; 307/526; 328/155; 331/27
[58] Field of Search ...................... 331/1 A, 11, 12, 25, 331/27; 307/511, 516, 525, 526; 328/133, 134, 155

[56] References Cited

U.S. PATENT DOCUMENTS 4,276,512 6/1981 Wittke .............................. 331/27 X
4,316,152 2/1982 Meyer ................................. 331/1 A Primary Examiner—Siegfried H. Grimm
Attorney, Agent, or Firm—Howard P. Terry; Seymour Levine

[57] ABSTRACT

A digital signal detector utilizing a detected input digital signal derived from a reference square wave and a received pulse train to establish phase and frequency variations between the reference signal and the received signal. The detected signal and the reference signal are coupled to up-down counters wherein overflow counts from preset values are obtained which are representative of the frequency and phase difference between the reference and received signals. These overflow counts are utilized to establish phase and frequency error correction signals which may be coupled to control the reference oscillator to provide frequency and phase lock between the reference and received signals.

6 Claims, 4 Drawing Figures

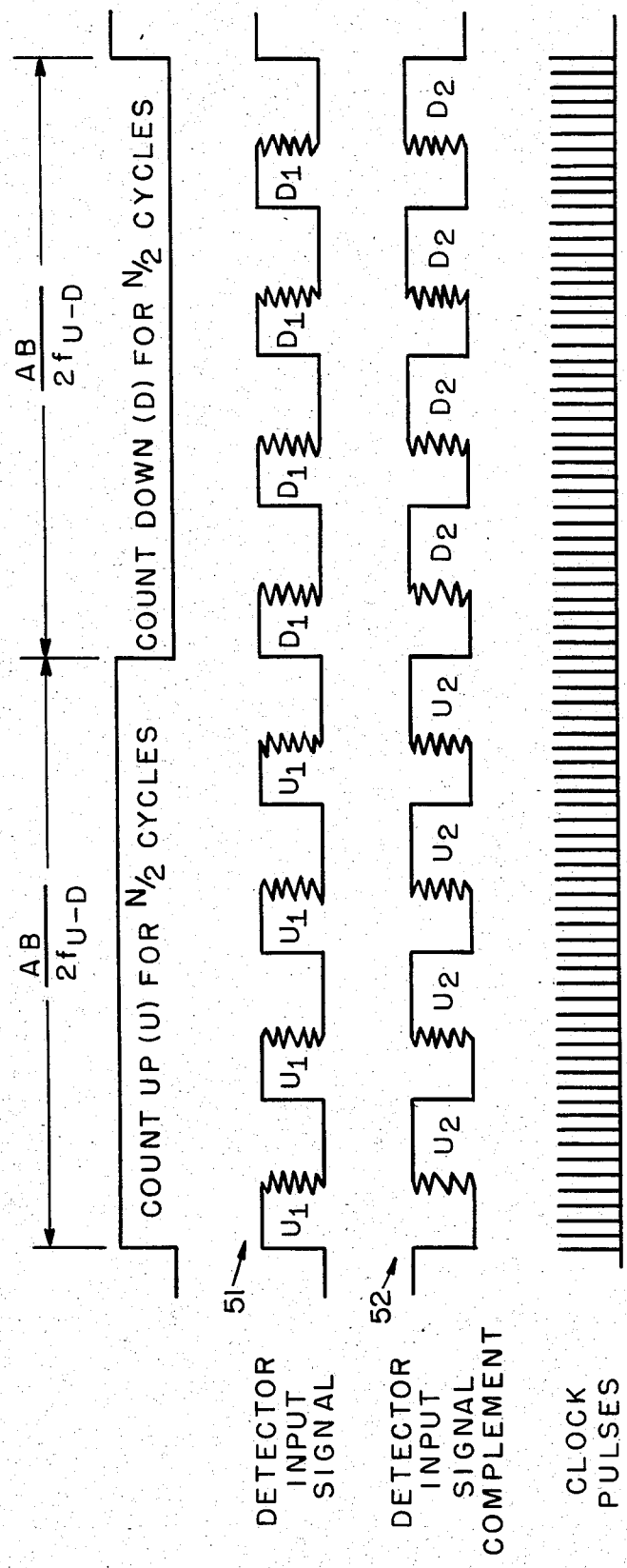

DIGITAL PHASE AND FREQUENCY DETECTOR

BACKGROUND OF THE INVENTION

1. Field of the Invention

The present invention relates to carrier frequency and phase, acquisition and tracking circuits for use in phase locked loop systems and more specifically to such circuits for use in phase locked loop systems with low carrier signal to noise ratios.

2. Description of the Prior Art

Carrier signal acquisition and tracking systems are known in the art. In particular, techniques for the acquisition and tracking of noisy signals such as those received from space or satellite vehicles are well established, see, for example, U.S. Pat. Nos. 4,457,006 Global Positioning System Receiver and 4,453,165 Differential Doppler Receiver, both issued to Reuben E. Maine and assigned to the assignee of the instant invention. In such systems a received RF carrier is typically modulated by a digital code sequence whose bit rate is much higher than the information signal bandwidth. One of the preferred modulation formats for these carriers is the biphase modulation technique in which a binary 1 and a binary 0 are represented by alternate 180° phase shifts. The signal bandwidth of such systems must allow for initial frequency uncertainty due to doppler shifts and non-coherent frequencies between the transmitting and receiving systems. Such bandwidths permit noise as well as information into the receiving system. In order to recover the information with a high probability of detection, the receiving system local signals must be made coherent with the received or incoming signals. This is generally accomplished with carrier frequency and phase, acquisition and tracking techniques.

In general, noisy signals are acquired and tracked with techniques which employ coherent processes, wherein a local reference is compared with the information signal to generate corrective signals for altering the frequency and phase of the local reference to match the frequency and phase of the information signal. Prior art techniques for providing coherent signal reception are effective but require relatively complex circuitry.

One of the better known and documented signal comparator and error detector circuits for coherent reception is the Costas loop, as described in the book "Digital Communications by satellite" by James J. Spilker, Jr. and published by Prentice-Hall in 1977. Costas loop circuitry, however, is relatively complex and, at least in part, utilizes analog techniques. A pair of signal multipliers, operating in phase quadrature, square the input signal. These multipliers are followed by circuitry which filter unwanted product signals and generate error correcting signals that are utilized to provide coherent reception. In some applications the error signals are filtered and amplified in analog circuitry to directly control the local signal, while in other applications the error signals are converted to digital format by an analog-to-digital converter for microprocessor control of the local signal.

In contrast, the circuit of the present invention is completely digital, requires no multiplication or signal squaring, and requires only counters and attendant digital logic functions to filter and process error correcting signals.

SUMMARY OF THE INVENTION

In accordance with the principles of the present invention, a detector input signal, comprising a train of rectangular pulses derived from a reference square wave and a received spread spectrum signal, is coupled to enable terminals of up-down counters such that counting occurs only during rectangular pulse intervals. A square wave signal, having a frequency lower than that of the detector input signal, is coupled to the up-down count function terminal to control the count direction. Thus, clock pulses are counted only during the occurrence of a rectangular pulse of the detector input signal, with the count direction determined by the reference square wave level. This establishes a total up count which is a direct function of the input enable excursions during the up count time and a total down count which is a direct function of the input enable excursions during the down count time. Since the square wave establishes equal up and down count times, an unbalance in the detected signal input, generated by frequency or phase offset of the received signal relative to a reference square wave, is indicated, due to circuit implementation, by excessive down counts. These excessive counts cause signals, representative of frequency or phase deviations, to be coupled to the counter borrow output terminals at a rate determined by the up-down signal frequency.

Two up-down counters are utilized to generate frequency error signals and two to generate phase error signals. One of the two frequency (or phase) up-down counters generates a positive polarity error signal (borrow) and the other frequency (or phase) counter generates a negative polarity error signal in accordance with the prevailing error sense necessary for tracking. Frequency error correction signals are generated at the output at the output terminals of the up-down counter wherein time averages of the frequency error signals are performed. At the completion of the frequency correcting function the two up-down counters employed for phase correction are enabled. One counter is utilized to advance phase and the other counter is utilized to retard phase of the reference square wave to achieve phase tracking of the received signal by the reference square wave. The phase error correcting signals are also coupled to a subsequent up-down counter to provide frequency correction signals during the phase tracking mode. This is accomplished by providing a frequency error correction resulting from the time average of the advance-retard phase error signals.

BRIEF DESCRIPTION OF THE DRAWINGS

FIG. 3 is an illustration of the waveforms and principles involved in deriving frequency and phase error signals by the apparatus of the invention.

DESCRIPTION OF THE PREFERRED EMBODIMENT

Figure 1:
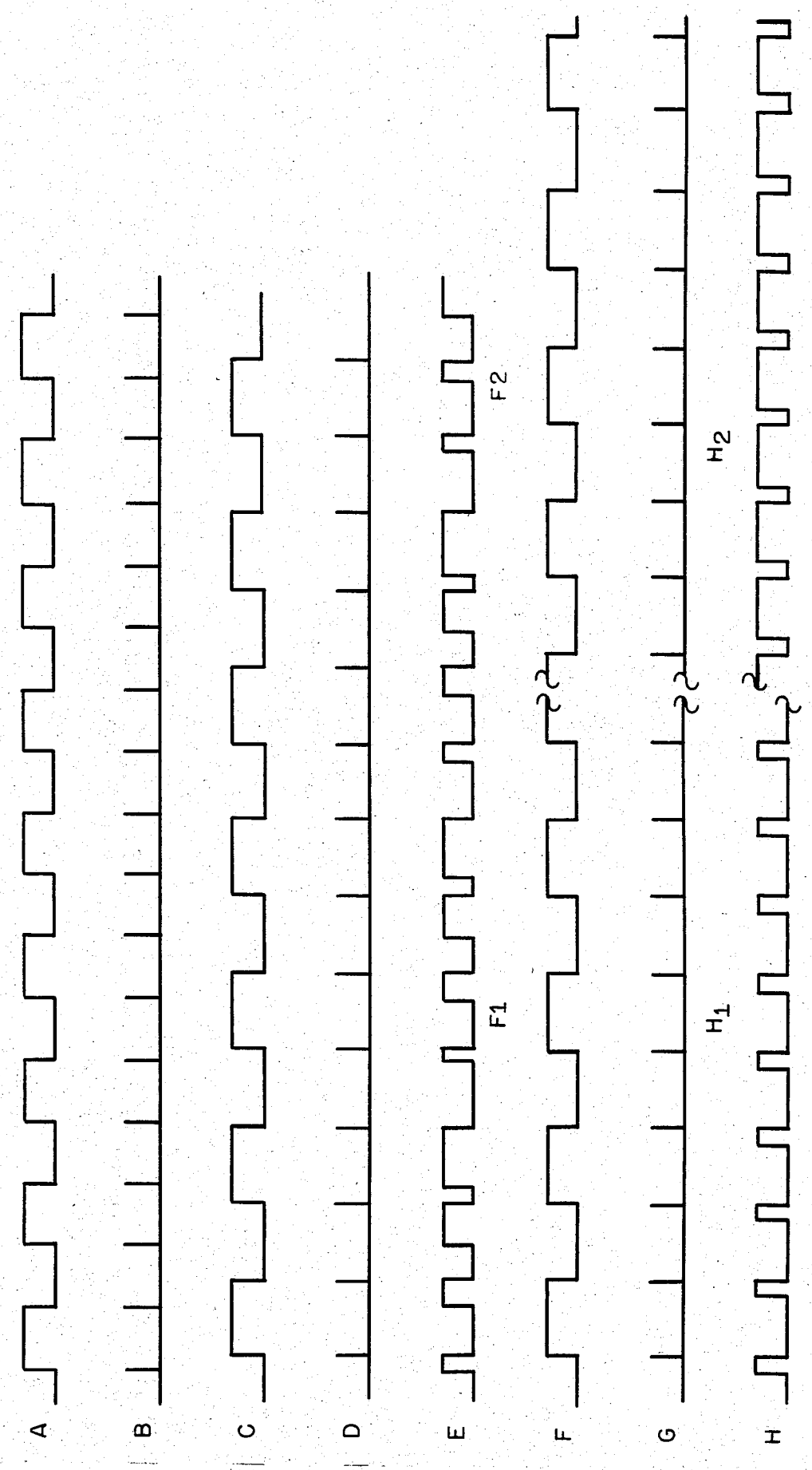
FIG. 1 is an illustration of waveforms associated with the apparatus of the present invention.

FIG. 1 illustrates the input signal waveforms applied to the present invention and commonly encountered in spread spectrum receiving systems as employed for example, in the GPS navigation system. For clarity of illustration the presence of noise superimposed on the received signal is not shown. This noise randomly alters the level transitions times of the received signal.

Referring to FIG. 1, a stable local reference signal A is utilized to generate level transition timing signals B. In like manner the received signal which may differ in frequency and phase with respect to the local reference, as for example waveform C, or differ in phase only, as for example, waveforms $F_1$ and $F_2$, is utilized to establish level transition timing signals D and G respectively for the waveforms C and F. These timing signals are combined and coupled to circuitry that toggles its output signal level with each received pulse, to construct the waveform E corresponding to the received waveform C or the waveform H corresponding to the received waveform F. This constructed waveform is the detector input signal coupled to terminal 12 in FIG. 2a.

The present invention determines the frequency and phase difference between the detector input signal and a reference square wave to provide the error signals representative thereof to a phase locked loop, operating in a conventional manner to control the reference square wave and extract information from the received signal.

Figure 2A:
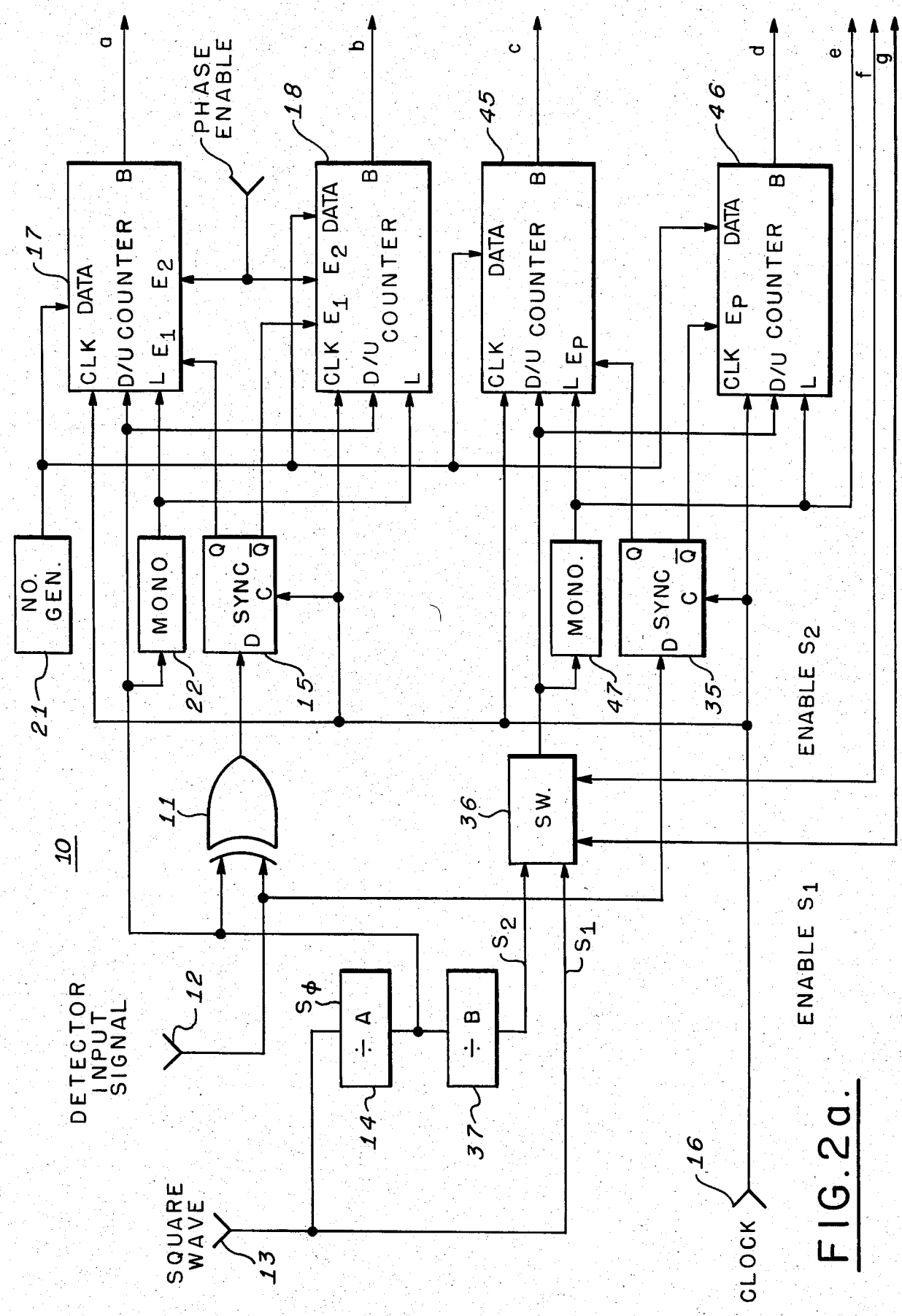
FIGS. 2a and 2b together are a block diagram of the presently preferred embodiment of the invention.
Figure 2B:
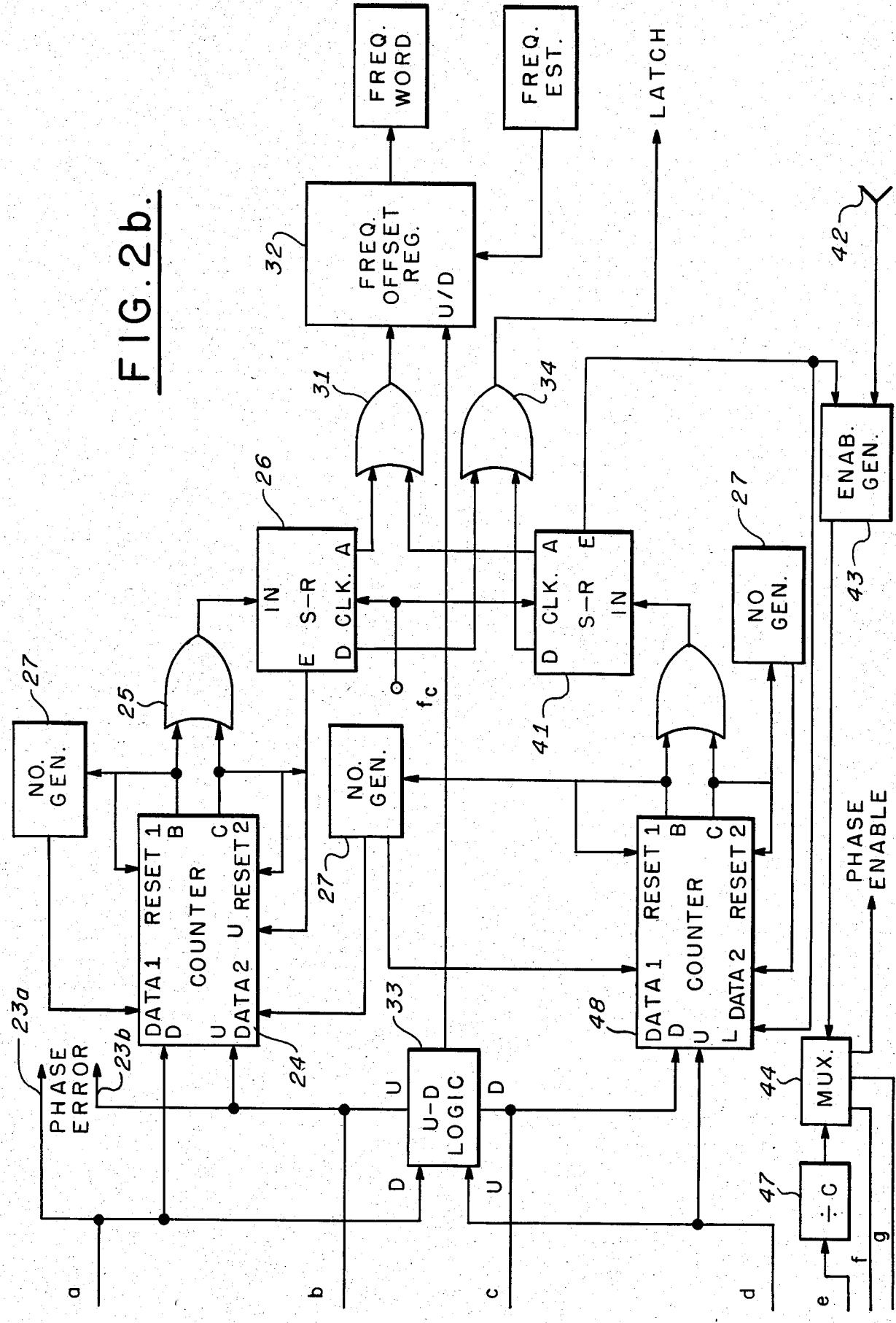

Referring now to FIGS. 2a and 2b, a digital signal detector 10 constructed in accordance with the principles of the present invention includes an exclusive OR gate 11, having one of its input terminals coupled to detector input signal terminal 12, and the other input terminal coupled to a reference square wave input terminal 13, via divider 14, wherein frequency division by a factor A is realized. The output of gate 11, a unipolar pulse train, is applied to the D input terminal of a signal synchronizing D-type flip flop 15, clocked by a high frequency clock signal coupled from terminal 16. The steady state clock frequency is a integer multiple of the input signal frequency at terminal 12. In accordance with the operation of D-type flip-flops, the signal at the D-terminal when the flip-flop is clocked, is transfered to the Q-terminal. Thus Q, and $\overline{Q}$, are similar to the D inputs and are in synchronism with the timing of the clock signal. The Q and $\overline{Q}$ output terminals are respectively coupled to enable input terminals $E_1$ of up-down counters 17 and 18, alternately enabling the counters and permitting the counts to proceed in accordance with the time sequence of the synchronized detector input signal. A second enable signal is coupled to enable input terminal $E_2$. The origin of this enable signal will be described subsequently.

The reference square wave signal from frequency divider 14 is applied to D/U terminals of U-D counters 17 and 18, in effect causing these counters to count up and count down in even increments of time by virtue of the square wave signal coupled to the D/U terminal. For the sake of brevity D refers to down, U refers to up. A preselected number, from number generator 21, is loaded into the U-D counters 17 and 18 by a pulse coupled to the load terminals L from a flip-flop 22, triggered by a pulse of the square wave from divider 14. The selected number is a design consideration and is determined by the error tolerance required and the signal to noise ratio of the detector input signal at terminal 12. Counting rate and comcomitantly phase error measurement resolution of the digital detector module is set by clock pulses coupled from clock input terminal 16. The borrow output terminals B of the U-D counters 17 and 18 provide output signals when the counters overflow on a down count. These signals represent phase errors between the input signal and the reference square wave, which is the output signal of a numerical controlled oscillator in a phase locked loop, not shown. These phase error signals, coupled to output terminals 23a and 23b, utilized in a phase locked loop, not shown, to establish and maintain phase lock between the signals at input terminals 12 and 13. Since the counters 17 and 18 are enabled alternately, that is, on the Q or $\overline{Q}$ outputs of flip flop 15, signals at the B terminals are mutually exclusive, therefore each phase error signal has a unique error correcting sense, and advances or retards the phase by fixed predetermined increments at a rate established by the frequency of the square wave coupled to the U-D terminals.

The phase error pulses from the B terminals of counters 17 and 18 are also coupled to U and D terminals of counter 24, respectively, thereby causing counter 24 to count up or down in accordance with the sense of the detected phase error. For example, when the up count exceeds the down count over an interval of the time, determined by the range of the counter, counter 24 will overflow at the carry terminal C generating a pulse. This pulse is coupled to one input terminal of OR gate 25, while the other input terminal is coupled to receive a pulse from the borrow terminal B when the down count exceeds the up count. Thus U-D counter 24, in combination with OR gate 25, generates pulses whenever phase error signals are coupled to U-D terminals of up-down counter 24.

The output of OR gate 25 is applied to a frequency error generating strobe, such as a serial in-parallel out shift register 26. This pulse is clocked into the initial stage A and subsequently into stages D and E of shift register 26 by clock pulses of frequency $f_C$ derived from the clock pulses at terminal 16. Pulses at the B and C terminals of up-down counter 24 are also coupled to reset the counter 24, while pulses at the final stage E of shift register 26 are coupled to load data, at the data terminals preselected through generator 27. This data biases the counter to hasten the generation of the carry or borrow pulses. Each pulse at stage A of shift register 26 is coupled via OR gate 31 to the input terminal of a counter 32, which functions as a frequency offset register. The word at the output terminals of counter 32 is coupled, directly or via a latch, not shown, to the numerically controlled oscillator in the phase locked loop to control the frequency of the oscillator. Pulses coupled from OR gate 31 increment the register up or down in accordance with signals coupled from up-down logic unit 33, wherein the phase error counts from counters 17 and 18 are compared to determine a phase lead or lag. Signals at stage D of shift register 26, arriving a few clock pulses after the initial entry into stage A, may be coupled, via OR gate 34 to generate latch signals for updating the stored frequency word that controls the numerically controlled oscillator. At the time counter 24 is loaded all the stages of the shift-register 26 have been reset to zero and the system is set to process subsequent signals representative of the reference square wave, detector input signal phase relationship.

Prior to establishing a phase lock between the reference square wave (numerically controlled oscillator) and the detector input signal, the frequency of the numerically controlled oscillator is locked to the detector input signal. This is accomplished in a manner similar to that for achieving the phase lock described above.

Referring again to FIGS. 2a and 2b, the detector input signal is coupled via input terminal 12 to the D input of flip flop 35, while the reference square wave at input terminal 13 is coupled to one terminal of switch 36 and to a second terminal of switch 36 after division by a factor AB in dividers 14 and 37. When a low level signal is present at the final stage E of shift register 41 and an initiation signal is coupled to terminal 42 of enable signal generator 43, multiplexer 44 causes switch 36 to couple the reference square wave, at the undivided frequency, to the U-D terminal of counter 45 and frequency correction is made in the manner previously described.

Clock pulses for multiplexer 44 are provided by dividing the output pulses from a monostable flip-flop 47 by a factor C, by the divider 49, and coupling the divided pulses to the clock terminals of the multiplexer 44. Multiplexer 44 will cause switch 36 to couple signal $S_2$, at the reference square wave frequency divided by the factor AB, to counter 45 and monostable flip-flop 47 when a clock pulse and enable signal are simultaneously coupled to the multiplexer 44. An enabling signal at the multiplexer occurs when the final stage of the shift register is at a low level, thereby indicating that the coarse frequency adjustment is complete. Frequency adjustments are then made for the $S_2$ signal in a similar manner, whereafter multiplexer 44 couples a phase enable signal to counters 17 and 18 and phase corrections are made as previously described.

The operation of the invention may be also explained by referring to waveforms of FIGS. 1 and 3.

Referring to FIG. 1, the detector input signal derived from the square wave A and received signal C, is a repetitive signal. Each cycle of this signal possesses a multiplicity of pulses having duty cycles that vary at a rate determined by the difference in frequency between the square wave reference signal A and the received signal C. As shown, the received signal C is lower in frequency than the reference signal. Before phase lock can be achieved the frequency of signal A must be adjusted to be equal to the frequency of the received signal C. Consider now waveform H, derived from the reference signal A and a received signal F having a phase offset from the reference square wave A. For this situation the detector input signal H is a string of pulses at a fixed repetition rate having a duty cycle that is determined by the phase offsets between the received signal F and the local reference A, as for example waveform $H_1$ for $F_1$ lagging A and waveform $H_2$ for $F_2$ leading A. To establish phase lock, the pulses of the reference square wave A must be advanced or retarded. When this is accomplished the detector input signal is a square wave having a 50% duty cycle, identical to the reference square wave and received signal.

Refer now to FIG. 3, wherein a detector input signal 51, its complement 52, and a U-D count cycle are shown. During each U-D count cycle unipolar excursions of a specific number of cycles of the reference signal enable a counter clocked by a frequency $f_C$. At the expiration of this period an equal number of unipolar excursions provide a down count which is compared to the up count. If the down count exceeds the up count a borrow signal is generated and utilized as a correcting signal. The change in phase of the detector input signal for each sensing (U-D) time is $$\Delta \phi = \frac{\Delta f \cdot 360}{f_{U-D}}$$

where $\Delta f$ is the offset frequency and $f_{U-D}$ is the frequency of the reference square wave.

The magnitude of the overflow count is $$\Delta \text{ count} = \frac{\Delta \phi \cdot N}{2 \times 360} \cdot \frac{f_{CLOCK}}{f_{U-D}}$$

$$= \frac{N \cdot \Delta f}{2} \cdot \frac{f_{CLOCK}}{(f_{U-D})^2}$$

This count is achieved by the present invention in the following manner. A detector input signal with or without significant attendant noise, from input terminal 12 is coupled to the D input of sync flip flop 35, the output signals of which Q and $\overline{Q}$ switch synchronously with clock pulses coupled to terminal 16. An enable signal coupled to enable generator 43 activates the enable $S_1$ line to switch 36, permitting $S_1$, the U-D square wave at terminal 13, to load U-D counters 45 and 46 and initiate an up count in each counter. This signal is also routed through monostable flip flop 47 to frequency divider 49, wherein a division by a factor C is performed. The output pulses resulting from this division are coupled to clock multiplexer 44. Half way through the U-D count a down count is initiated. The ranges of the U-D counters 45, 46, 17, and 18 are chosen so that no overflow occurs on an up count.

The number of cycles of the input signal sampled (N) per U-D count cycle, and therefore the U-D frequencies are for the most part selected from the following considerations:

$S_1$, the coarse acquisition range frequency is sufficiently large to keep $\Delta \phi \leq 180°$ per U-D cycle, to avoid error sense ambiguity $S_2$, the fine acquisition range frequency is sufficiently small to pull frequency uncertainty $\Delta f$ to within the capture range of the phase locked loop.

$S_0$, the up-down rate during phase tracking must be sufficiently small to attain an adequate probability of detection in the presence of a noisy signal as is set forth in communications theory.

Referring again to FIGS. 2a and 2b, counter 45 will overflow if $\Delta f$ the difference frequency is negative or counter 46 will overflow when $\Delta f$ is positive, the extent of the overflow as previously given being $$\text{count} = \frac{N \cdot \Delta f}{2} \cdot \frac{f_{clock}}{(f_{U-D})^2}$$

Overflow pulses occuring at the U-D frequency clock U-D counter 48 until an overflow occurs at which time shift register 41 generates a clock pulse from stage A to adjust the frequency of the square wave reference generator in the phase locked loop by a fixed increment. Shift register 41, clocked at a rate $f_C$, generates an output pulse at a subsequent clock pulse from Stage D to latch the updated frequency information. A subsequent pulse from stage E causes multiplexer 44 to maintain the enable $S_1$ function. Simultaneously U-D counter 48 is loaded with the count preset at the DATA terminals. This in effect re-initiates counter 48 for a new comparison between the input up and down pulses from counters 45 and 46. The numbers loaded into counter 48 may be chosen to significantly speed up the frequency acquisition process. This may be done by biasing the load number in accordance with the error signal sense. For example assume counter 48 is a divide by 16 binary counter and that the initial frequency offset generates a carry C pulse after binary 15. This carry pulse is coupled to shift register 41 and to the number generator 27 to increment the reference number prior to loading. This increment speeds up the generation of the next carry pulse by loading a number a few counts below binary 15. In like manner DATA 1 is loaded to speed up generation of borrow output pulses.

The process of overflow from counters 45 and 46 generating error signals and correcting the difference frequency continues until the count resulting from $\Delta f$ no longer generates error correction signals. At this time a function shift signal is coupled to multiplexer 44 and shift enable $S_2$ occurs. This causes a lower U-D frequency, thereby increasing the error count, since this count is proportional to $$\left(\frac{1}{F_{U\text{-}D}}\right)^2.$$

The foregoing process is repeated until the multiplexer 44 shifts to disable the frequency acquisition circuitry and enable the phase correction circuitry.

As opposed to prior art frequency and phase detectors the circuit of the present is conceptually simple, flexible in application and completely digital requiring no alignment or adjustment. Parameters such as U-D sample rate, U-D counter range number loading, and clock quantization may be varied to fulfill a broad range of system applications.

While the invention has been described in its preferred embodiment it is to be understood that words of description have been used rather than words of limitation and that changes may be made within the purview of the appended claims without departing from the scope of the invention in its broader aspects.

I claim:
1. A digital signal detector comprising:
   means for providing a reference signal at a frequency $f_1$ and phase $p_1$;
   means for providing an input signal representative of a signal at a frequency $f_2$ and phase $p_2$;
   means for providing clock pulses;
   count means responsive to said reference signals, said input signals, and said clock pulses for counting said clock pulses when $p_1$ differs from $p_2$ and when $f_1$ differs from $f_2$, and for providing output signals indicating phase and frequency differences when clock pulse counts exceed preselected count values.
2. A digital signal detector in accordance with claim 1 wherein said count means includes:
   first synchronizing means coupled to receive said input signal and said clock pulses for providing said input signal at a first output terminal and a signal complementary to said input signal at a second output terminal with each received clock pulse; and
   first and second up-down counter means having enable terminals coupled respectively to said first and second output terminals of said first synchronizing means, and count direction control terminals coupled to receive said reference signal for counting clock pulses coupled thereto and providing output pulses at overflow terminals when said clock pulse counts exceed preselected count values.
3. A digital signal detector in accordance with claim 2 wherein said count means further includes:
   gate means coupled to receive said input signal and a signal representative of said reference signal for providing a signal having a predetermined logic level at an output terminal when either but not both, said input signal or said signal representative of said reference signal are at said predetermined logic level and a logic level complementary to said predetermined logic level otherwise,
   second synchronizing means having an input terminal coupled to said output terminal of said gate means for providing said gate means output signal at a first output terminal, and a signal complementary to said gate means output signal at a second output terminal, and
   third and fourth up-down counter means having enable terminals coupled respectively to said first and second output terminals of said second scynchronizing means, and count direction control terminals coupled to receive said signal representative of said reference signal for counting clock pulses coupled thereto and providing output pulses at overflow terminals when said clock pulse counts exceed preselected count values.
4. A digital signal detector in accordance with claim 3 wherein said count means includes:
   first overflow counter means having up-down control terminals coupled to said overflow terminals of said first and second up-down counters respectively for providing carry and borrow pulses in accordance with clock pulse counts that exceed loaded count values;
   second overflow counter means having up-down control terminals coupled to said overflow terminals of said third and fourth up-down counters respectively for providing carry and borrow pulses in accordance with clock pulse counts that exceed loaded count values;
   first and second shift register means respectively coupled to receive said carry and borrow pulses from said first and second overflow counter means for serial storage in a plurality of register stages having individual output terminals; and
   frequency offset register means coupled to an output terminal of a selected one of said plurality of register stages for establishing corrected frequency control signals to alter said reference signal frequency in response to signals received from said selected one stage.
5. A digital signal detector in accordance with claim 4 wherein said count means further includes up-down logic means having input terminals coupled to said overflow terminals of said first, second, third, and fourth up-down counter means and an output terminal coupled to said frequency offset register means for establishing correction directions in establishing said frequency control signals.
6. A digital signal detector in accordance with claim 5 further including multiplexing means coupled to receive signals representative of said reference signal for sequentially providing enabling signals to a multiplicity of output terminals one of which is coupled to enable terminals of said third and fourth up-down counters; and
   switch means coupled to receive enabling signals from said multiplexing means having an output terminal coupled to said count direction control terminals of said first and second up-down counter means, a first input terminal coupled to receive said reference signal and a second input terminal for selectively coupling said first and second input terminals to an output terminal in response to said enabling signals; and divider means coupled between said reference signal means and said second input terminal of said switch means for reducing said frequency $f_1$ by a predetermined factor.

* * * * *